United States Patent [19]

Tucker et al.

[11] 4,297,648
[45] Oct. 27, 1981

[54] MICROWAVE FREQUENCY DIVISION BY PHASE LOCKED LOOPS

[75] Inventors: Trevor W. Tucker; William D. Cornish, both of Ottawa, Canada

[73] Assignee: Her Majesty the Queen in right of Canada, as represented by the Minister of National Defence, Ottawa, Canada

[21] Appl. No.: 63,171

[22] Filed: Aug. 3, 1979

[30] Foreign Application Priority Data

Aug. 31, 1978 [CA] Canada ............................... 310452

[51] Int. Cl.³ .............................................. H03L 7/00
[52] U.S. Cl. .................................... 331/1 R; 331/25
[58] Field of Search ....................... 331/17, 18, 25, 16,
331/1 A, 1 R, 32, 176, 74

[56] References Cited

U.S. PATENT DOCUMENTS 3,535,651  10/1970  Peterson .............................. 331/17
3,988,696  10/1976  Sharpe .................................. 331/25

*Primary Examiner*—David K. Moore
*Attorney, Agent, or Firm*—Larson and Taylor

[57] ABSTRACT

It is known to generate mircowave frequencies by locking the fundamental output frequency of a microwave oscillator to a multiple or sub-multiple of the output frequency of a highly stable crystal oscillator operating at a lower frequency than the microwave oscillator. Phase-locked loops are used together with frequency multipliers or dividers. One problem is that the frequency lock range decreases as successively higher and weaker harmonics are used for locking. This limits the practical harmonic locking range to multiples of approximately less than ten. The present invention eliminates this problem and allows microwave signals which have a frequency greater than 10 times the reference frequency to be phase locked without an impractical reduction of the capture range. As well, in conventional phase locked loop systems which use multipliers, fm modulation which is intentionally injected must have a modulation index less than 1.0. The present invention eliminates this problem and increases the allowed modulation index by a factor N, where N is the division ratio of the frequency divider used in the feedback loop. The present invention uses a microwave parametric frequency divider to phase lock a microwave oscillator to a stable reference oscillator without the need for frequency multipliers. The output f1 of an rf oscillator is divided by N and fed to one input of a phase detector. The phase detector has another input fed by a reference oscillator of predetermined frequency $f_2$. The phase detector has an output fed to a control input of the rf oscillator which causes the rf oscillator to produce a frequency of $Nf_2$ which is directly fed to the rf output of the apparatus. Note that no multiplier is required.

2 Claims, 5 Drawing Figures

MICROWAVE FREQUENCY DIVISION BY PHASE LOCKED LOOPS

This invention relates to apparatus for producing a stable microwave frequency signal.

It is known to produce microwave frequencies by phase locking the fundamental output frequency of a microwave oscillator to a multiple or submultiple of the output frequency of a highly stable crystal oscillator operating at a lower frequency than the microwave oscillator. Phase-locked loops are used together with frequency multipliers or dividers. For example, the output of a reference oscillator may be multiplied and fed to one input of a phase detector. The other input of the phase detector is from a microwave frequency rf oscillator and the output of the phase detector controls the output frequency of the rf oscillator so that it is a multiple of the frequency of the reference oscillator. Instead of a multiplier, a harmonic generator may be used between the reference oscillator and phase detector and then the output of the rf oscillator may be multiplied. In another system, a reference oscillator feeds one input of a phase detector and the other input of the phase detector is fed by the digitally frequency divided output of an rf oscillator. The rf oscillator output frequency is then controlled by the output of the phase detector. The output of the rf oscillator is then multiplied to the desired frequency range.

A problem with all of these approaches is that there is a multiplier outside the feed-back loop. This can cause unwanted signals which are not attenuated by the feedback loop and which may require extra filtering to remove. As well, in cases where the phase comparison is done at a higher frequency than the reference frequency, problems of decreased frequency locking range and reduced allowable fm modulation index exist.

An object of the present invention is to provide apparatus for producing a microwave signal with high frequency accuracy, high spectral purity, low noise and high frequency stability.

Thus, in accordance with the broadest aspect of the invention, there is provided apparatus for producing a stable microwave frequency signal comprising an rf oscillator for supplying microwave signals of frequency $f_1$ to an output terminal of the apparatus and to an input of a frequency divider, said frequency divider dividing said microwave signals by N, where N is an integer, and feeding one input of a phase detector, said phase detector having another input fed by a reference oscillator of frequency $f_2$, where $f_2 = f_1/N$, said phase detector having an output connected to a control input of said rf oscillator whereby the output frequency of said rf oscillator is adjustable to equal $Nf_2$.

The invention will now be further described in conjunction with the accompanying drawings, in which.

Figure 1:
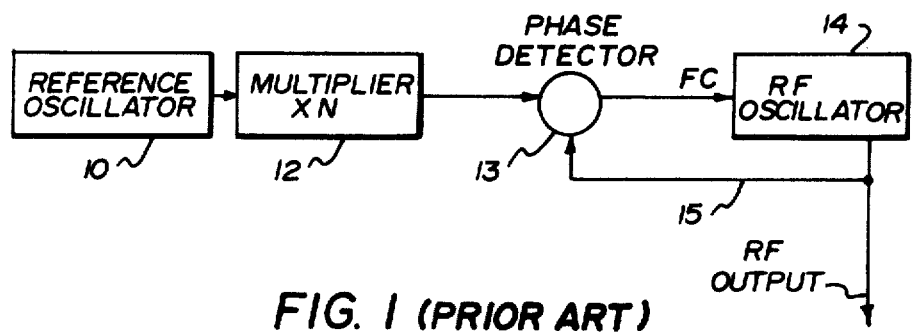
FIG. 1 is a block diagram of one type of microwave frequency generator.

Referring to FIG. 1, the output frequency of the reference oscillator 10 is multiplied (XN) in multiplier 12 up to the desired rf frequency. A phase detector 13 compares the multiplied reference frequency with the output frequency of oscillator 14 as fed back over line 15 to another input of the phase detector. The phase detector produces an output signal that depends on the difference between its two inputs and this signal is used to adjust the rf oscillator frequency to N times that of the reference. In this way an rf signal is produced that approaches the stability of the Nth harmonic of the reference oscillator 10.

Figure 2:
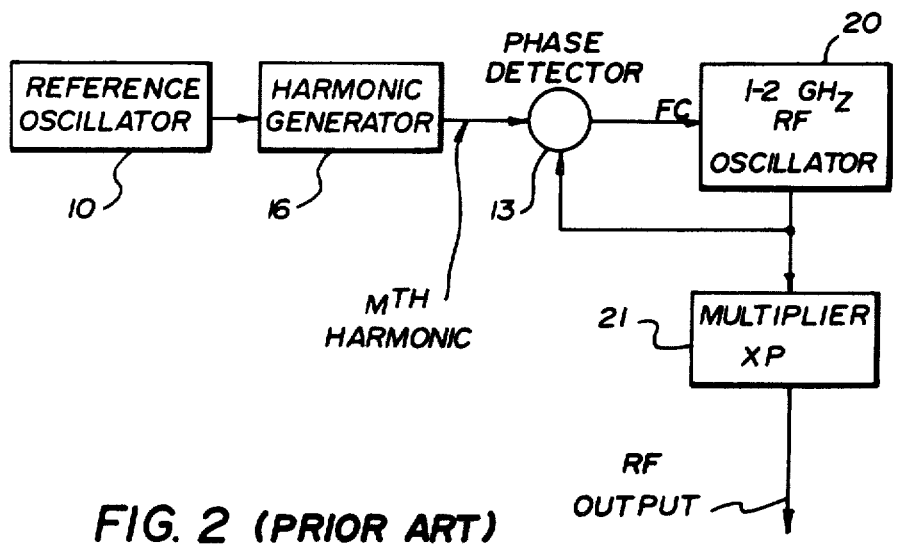
FIG. 2 is a block diagram of another known type of microwave frequency generator.

Referring to FIG. 2, the same result is here achieved in a slightly different manner. The output of the reference oscillator 10 drives a harmonic generator 16. The Nth harmonic is compared to the output of an rf oscillator 20 in the one to two GHz region in the same manner as described for FIG. 1, this comparison being done in the phase detector 13. The stabilized output of the 1-2 GHz oscillator 20 is then multiplied (XP) in multiplier 21 up to the required rf frequency.

Figure 3:
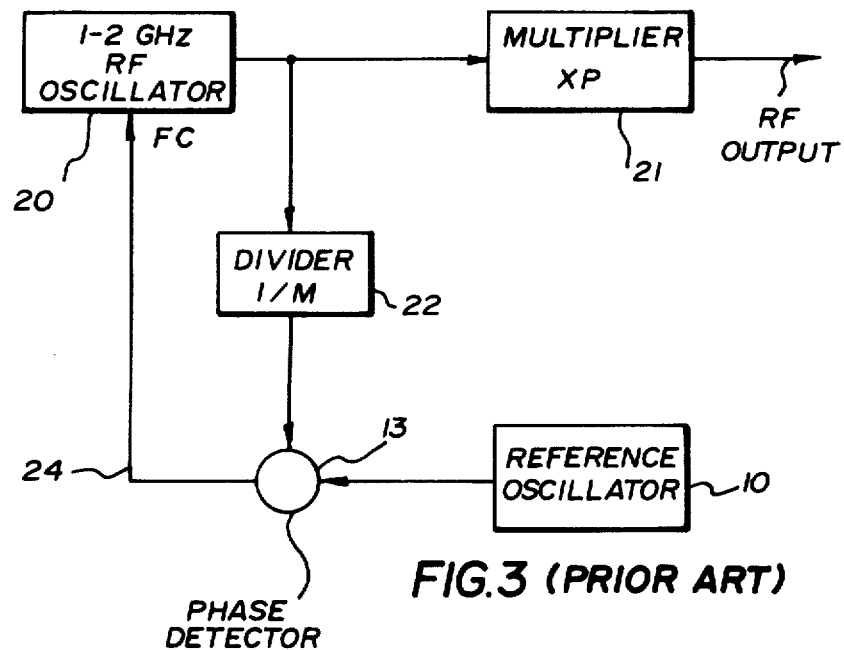
FIG. 3 is a block diagram of a third type of known microwave frequency generator.

FIG. 3 uses a third variation to stabilize the signal. The 1-2 GHz frequency from oscillator 20 is divided by M in divider 22 and then compared in phase detector 13 with the frequency of reference oscillator 10. Note that the type of divider used here is based on digital rather than analog techniques, and is only operable to approximately 2 GHz. The output of the phase detector 13 is fed back over line 24 to adjust (stabilize) the frequency of the rf oscillator 20. This is then multiplied (XP) in multiplier 21 to achieve the desired rf frequency.

A problem associated with the arrangements shown in FIGS. 1 and 2 is that the modulation frequency fm that may be applied to the rf oscillator must be greater than about 1.5 times the 3 dB loop bandwidth. Otherwise the phase-lock loop will treat the modulation as an error signal and cancel it out. As well, the maximum deviation $\Delta f$ must not exceed fm, otherwise the loop can lock to a modulation sideband. Therefore the modulation index ($\Delta f$/fm) must be less than unity.

The present invention avoids the foregoing problem by using a frequency divider to phase-lock a microwave signal to a stable reference oscillator without the need for frequency multipliers. The frequency deviations $\Delta f$ applied at the rf oscillator is divided by N along with output of the rf oscillator. Thus for a modulation index of 1.0 at the phase comparator, the frequency deviation $\Delta f$ at the rf oscillator is $$\Delta f = N \times fm$$

This means that the effective modulation index has been increased by a factor N.

FIG. 3 will also produce this result, when $N = P \times M$, however this arrangement has the disadvantage of having the multiplier 21 outside the feed-back loop. Any spurious signals such as harmonics generated in the multiplier will not be attenuated by the phase-locked loop. This problem is eliminated in the present invention.

Figure 4:
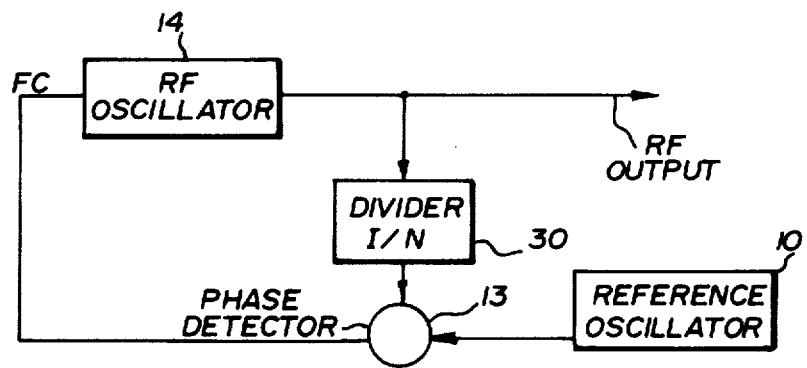
FIG. 4 is a block diagram of a microwave frequency generator according to the present invention.

FIG. 4 show a block diagram of the fundamental system according to the invention. Various filters and amplifiers which may in practice be used have been omitted for simplicity.

A portion of the output signal from the rf oscillator 14 is divided by N in divider 30 so that it may be compared to the frequency of the stable reference oscillator 10 by phase detector 13. The output of the phase detector 13 is used to adjust the frequency of the rf oscillator 14 to that of the reference.

The analog frequency divider for use above 2 GHz is preferably such as disclosed in Canadian Pat. No. 1,041,614 which issued on Oct. 31, 1978 in the name of Her Majesty the Queen in Right of Canada as represented by the Minister of National Defence and entitled Broadband Frequency Divider Using Microwave Varactors. Prior to the development of such frequency dividers, it was not possible to provide microwave frequency division with adequate signal conversion characteristics such as, for example, turn-on time of frequency division, ability to divide frequency modulated (f.m.) signals and ability to convert frequency spectra with acceptable degradation.

Figure 5:
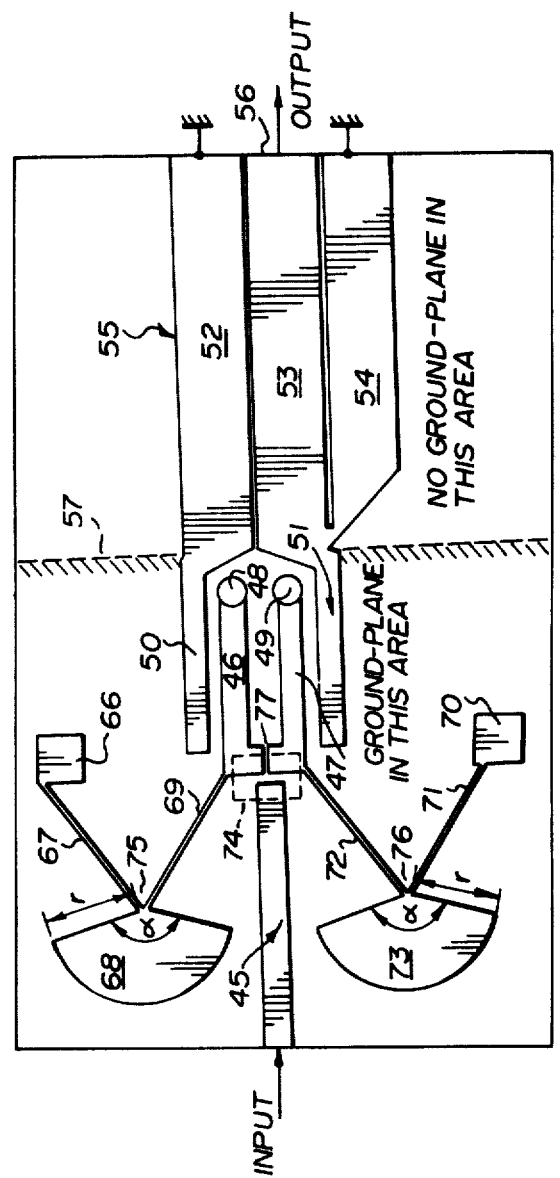
FIG. 5 is a diagram of an analog frequency divider which may be used in the present invention.

Referring to FIG. 5, there is shown a diagram of an analog frequency divider which may be used as the frequency divider 30 of FIG. 4. A microwave frequency signal at the input of frequency $f_1$ appears at the output as a signal of frequency $f_1/2$. A number of frequency dividers according to FIG. 5 may be connected in cascade, with intermediate amplifiers if necessary. Each stage divides the signal at its input by 2 so that if there are n stages, the ultimate output signal has a frequency of $1/2^n$ of the input frequency.

Although not disclosed herein, divide-by-4 analog frequency dividers can be constructed and can be used in the present invention. These would be cascaded in the same manner as divide-by-2 devices except that for n stages the output signal would be $(1/4)^n$ of the input frequency.

The divider of FIG. 4 would be that shown in FIG. 5 (or the divide-by-4 mentioned above) at frequencies above about 2 GHz but below 2 GHz digital dividers could be used in the cascaded chain.

FIG. 5 is, except for reference numerals, identical to FIG. 8 of the abovementioned Canadian patent application and reference may be had to that application for a more detailed discussion of the analog frequency divider. However, sufficient disclosure is included here for understanding of the present invention.

The frequency divider, which operates in the microwave frequency range, employs strip line or microstrip transmission lines, balanced varactor diodes and a coplanar balun. The divider consists essentially of a basic resonant circuit which has two or more transmission lines, each such line being terminated with a varactor diode at one end of the line. The lines are electrically connected or electromagnetically coupled at the other end. The diodes are selected so as to be matched. Means are provided for introducing a signal to the basic resonant circuit and for extracting an output signal from the circuit. Strip lines, microstrip lines, varactor diodes and baluns are all known in the art and need not be explained here.

Referring to FIG. 5, the microstrip transmission line 45 carries an input electrical signal to microstrip transmission lines 46 and 47 through DC blocking chip capacitor 74 which is located between the microstrip line 45 and lines 46 and 47. At microwave frequencies, capacitor 74 is a short circuit.

Lines 46 and 47 are terminated with varactors 48 and 49. One terminal of each varactor is connected to an end of one of the transmission lines 46 and 47 and the other terminal is grounded by connection to the metallic ground plane of the microstrip transmission lines. It will be understood, of course, that the ground plane is on the underside of the device shown in FIG. 5 which is a top plan view.

The circuit comprising lines 46 and 47 and varactors 48 and 49 forms a basic resonant circuit which supports oscillation at ½ of the frequency appearing on input line 45 if the input signal on line 45 is approximately sinusoidal and if the length of lines 46 and 47 is appropriately chosen for the frequencies involved. The circuit is broadband in nature. For example, if the input signal contains frequency components ranging from 5–10 GHz and a desired output frequency range of 2.5–5 GHz were desired, then the circuit parameters would be chosen using the upper output frequency of 5 GHz as the approximate basic resonant frequency. (This is a small-signal resonant frequency). In summary, lines 46 and 47 and varactors 48 and 49 act in combination to form a sub-harmonic frequency generator with a balanced output signal.

The purpose of the balun 55 and coupling microstrip transmission lines 50 and 51 is to extract an output signal from the basic resonant circuit. Although FIG. 5 is here being discussed in terms of microstrip lines, it will be understood that strip lines and perhaps other types of lines may be used instead.

Open circuited microstrip transmission lines 50 and 51 are located adjacent to lines 46 and 47 of the basic resonant circuit and so a signal is induced by electromagnetic coupling into lines 50 and 51 from lines 46 and 47. The balanced signal appearing on lines 50 and 51 is conveyed to balun 55 and then to line 56 where it appears as an unbalanced output signal.

The significant result is the conversion of the balanced signal of a given input frequency to an unbalanced signal of an output frequency equal to half the input frequency. Ordinary care should be taken in the location and dimensioning of the circuit components, so that unwanted resonance and interference effects, etc., do not arise.

There is no ground plane in the balun section which lies to the right of line 57.

The generation of sub-harmonic frequencies is a result of the well known specific non-linear nature of the varactors 48 and 49 in the basic resonant circuit.

In general, the length of lines 46 and 47 will correspond to an electrical length somewhat less than $\lambda/4$ at resonance frequency. Routine experimentation may be used to determine appropriate dimensions. However, the device shown in FIG. 5 was designed to accommodate an input frequency range of 8.5 to 9.5 GHz. The microstrip line 45 may be used an an input matching transformer, in which case its impedance will be different from the normal 50 ohms and its length will be $\lambda/4$ at or near the center of the input band of frequencies. Further, capacitor 74 may be chosen to partially annul the inductive part of the input impedance. The input impedance of the basic resonant circuit looks inductive because the input frequency is in general higher than the resonance frequency.

DC bias is applied to the matched pair of varactors 48 and 49 by way of pads 66 and 70 which consist of layers of conducting material placed upon the surface of the substrate layers. The substrate may be alumina. An individual source of DC voltage may be applied to each pad or a common source may be applied to both pads 66 and 70. In either case, one terminal of a DC source is connected to (say) pad 66 and the other terminal of the DC source is connected to the ground conductive layer. Radial transmission lines 68 and 73 at operational microwave frequencies have zero or very small input impedances at points 75 and 76. Such radial or "half-moon"

lines are discussed and partially analyzed by D. A. Syrett in a Master of Engineering Thesis at Carleton University in Ottawa, Canada, January, 1973, entitled "The Use of the Automatic Network Analyzer in the Development and Modelling of a Novel Broadband Bias Line for X-Brand Microstrip Circuits". The optimum value of angle α is 150°. This value was not found by Syrett. The radius "r" of the "half-moon" lines is approximately a quarter of a wave length at the center frequency of the input band of frequencies. Transmission lines 67, 69, 71 and 72 have a physical length which is also ¼ of a wave length at the center frequency of the input band of frequencies. So, at point 77, the impedance looking back at radial lines 68 and 73 is substantially that of an open circuit or infinity. The impedance of the bias circuit at the output frequencies is irrelevant because, at resonance, point 77 is a virtual ground.

Two biasing circuits are provided to (1) preserve the overall symmetry of the device and (2) permit independent biasing of the two varactors to optimize the balance if necessary. In case (2), two separate blocking capacitors 74 would be used, one from 45 to 46, the other from 45 to 47. The electrical length of the co-planar balun is chosen to be λ/4 at the center of the output band of frequencies.

As shown in FIG. 5, the entire microstrip and co-planar balun circuit is intentionally skewed with respect to its substrate. This permits the input and output connectors to transmission line 45 and output point 56, being one end of arm 53 of the balun, to be located on the center line of a metal enclosure box which holds the entire device.

The resonance frequency $f_o$ of the device increases as the reverse DC bias is increased. This is because the average capacitance of the varactor changes with the bias voltage, as is known. The DC bias may be zero volts, although a DC return is required in order to prevent the varactors being charged and hence changing their capacitance.

For proper operation, the input power should be 15 dBm or greater.

It is believed that the foregoing description of FIG. 5 is sufficient to understand the present invention. For a more detailed explanation of the theory and operation of the frequency divider, reference should be had to the aforementioned Canadian patent application.

Although the preferred embodiment has been described above as utilizing a particular form of microwave frequency divider it is expected that other types of microwave frequency dividers will be developed which would also function satisfactorily in apparatus according to the present invention.

The embodiments of the invention in which an exclusive property or privilege is claimed are defined as follows:

1. Apparatus for producing a stable microwave frequency signal comprising an rf oscillator for supplying microwave signals of frequency $f_1$ above 2 GHz to an output terminal of the apparatus and to an input of a microwave analog frequency divider, said frequency divider dividing said microwave signals by N, where N is an integer, and a phase detector having one input connected to receive the output of said frequency divider, said phase detector having another input fed by a reference oscillator of frequency $f_2$, wherein $f_2 = f_1/N$, said phase detector having an output connected to a control input of said rf oscillator whereby the output frequency of said rf oscillator is adjustable to equal $Nf_2$, said frequency divider comprising resonant circuit means, comprising at least two microwave transmission lines and a corresponding number of non-linear reactance elements, for receiving said microwave signal and for providing a balanced output signal of a frequency 1/N times the input signal, said microwave transmission lines comprising terminated microstrip transmission lines and said non-linear reactance elements comprising varactor diodes located at the terminated ends of the microstrip transmission lines, said frequency divider further comprising a balun electromagnetically coupled to said microstrip transmission lines.

2. Apparatus for producing a stable microwave frequency signal comprising an rf oscillator for supplying microwave signals of frequency f above 2 GHz to an output terminal of the apparatus and to an input of a microwave analog frequency divider, said frequency divider dividing said microwave signals by N, where N is an integer, a phase detector having one input connected to receive the output of said frequency divider, said phase detector having another input fed by a reference oscillator of frequency $f_2$, wherein $f_2 = f_1/N$, said phase detector having an output connected to a control input of said rf oscillator whereby the output frequency of said rf oscillator is adjustable to equal $Nf_2$, said frequency divider being an analog frequency divider and comprising: (a) an even number of matched microwave varactor diodes, each of said diodes having a unique first terminal and a unique second terminal; (b) a plurality of terminated microstrip transmission lines equal in number to the number of diodes, each of said plurality of terminated microstrip transmission lines comprising a first conductor and a second conductor, one end of the first conductor and one end of the second conductor defining a first end of the said last mentioned transmission line, and the other end of the first conductor and the other end of the second conductor defining a second end of the last mentioned microstrip transmission line, a unique one of each of said diodes terminating said second end of a corresponding unique one of said transmission lines by connecting said first conductor at said second end to said first terminal of said diode and connecting said second conductor at said second end to said second terminal of said diode; (c) an input microstrip transmission line coupled to said first end of all of said plurality of terminated transmission lines for conveying an input signal to said plurality of transmission lines; (d) a balun electromagnetically coupled to said plurality of microstrip transmission lines, said balun transforming a balanced signal from said plurality of microstrip transmission lines into an unbalanced output signal; (e) microstrip means positioned in the vicinity of said plurality of transmission lines and electromagnetically coupled therewith and electrically connected to said balun for conveying a signal from said plurality of lines to said balun.

* * * * *